United States Patent
Kwon

(10) Patent No.: US 6,711,074 B2
(45) Date of Patent: Mar. 23, 2004

(54) CIRCUIT AND METHOD FOR REPAIRING COLUMN IN SEMICONDUCTOR MEMORY DEVICE

(75) Inventor: Oh Won Kwon, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 61 days.

(21) Appl. No.: 10/175,385

(22) Filed: Jun. 19, 2002

(65) Prior Publication Data

US 2003/0031061 A1 Feb. 13, 2003

(30) Foreign Application Priority Data

Jun. 28, 2001 (KR) ......................... 2001-37484

(51) Int. Cl.[7] ............................ G11C 7/00; G11C 29/00; G11C 8/00
(52) U.S. Cl. ............... 365/200; 365/225.7; 365/230.03; 365/230.06
(58) Field of Search ............... 365/200, 225.7, 365/230.03, 230.06

(56) References Cited

U.S. PATENT DOCUMENTS

| | | | | |
|---|---|---|---|---|
| 5,757,716 A | * | 5/1998 | Lee | 365/230.03 |
| 5,959,903 A | * | 9/1999 | Chen et al. | 365/200 |
| 6,084,807 A | * | 7/2000 | Choi | 365/200 |
| 6,141,268 A | * | 10/2000 | Chen et al. | 365/200 |
| 6,141,779 A | * | 10/2000 | Hill et al. | 714/710 |

FOREIGN PATENT DOCUMENTS

| | | |
|---|---|---|
| KR | 1019950000275 | 12/1995 |
| KR | 1019990167678 | 1/1999 |

OTHER PUBLICATIONS

Notice of Rejection for Korean Patent Application No. 10–2001–0037484, dated Apr. 22, 2003.

* cited by examiner

*Primary Examiner*—David Nelms
*Assistant Examiner*—Ly Duy Pham
(74) *Attorney, Agent, or Firm*—Marshall, Gerstein & Borun LLP

(57) ABSTRACT

Circuits and methods for repairing a column in repairing a row by using an adjacent block are disclosed. An adjacent block selecting fuse unit generates an adjacent block selecting signal in response to a column redundancy start signal. The adjacent block selecting signal determines whether to use either row repair lines of a block designated by an externally inputted block address or row repair lines of an adjacent block of the block. A fuse unit receives the column redundancy start signal, the adjacent block designating bit, the inverted adjacent block designating bit and a plurality block address bits in which the adjacent block designated bit and the inverted adjacent block designating bit are removed from the block address and the inverting block address, and outputs an output signal.

16 Claims, 8 Drawing Sheets

CIRCUIT AND METHOD FOR REPAIRING COLUMN IN SEMICONDUCTOR MEMORY DEVICE

TECHNICAL FIELD

The present disclosure relates to circuits and methods for repairing a column in a semiconductor memory device, and more particularly, to a circuit and method for repairing a column in a semiconductor memory device which is improved to change an externally inputted block address in a row active state according to a block address for column repair in a structure for sharing row repair lines of an adjacent block memory array.

BACKGROUND

Generally, under the condition that even one cell among a plurality of fine cells comprising a dynamic random access memory (DRAM) is defective, the DRAM cannot perform a normal function. A redundancy method has been widely employed to increase a production yield by replacing the defective cell with a spare memory cell previously mounted into the DRAM. Such a redundancy method is used for replacing a defective cell with a redundancy cell prepared in rows and columns in advance when a memory cell is checked as defective, thereby wasting no chip.

A conventional repair method is explained with reference to FIGS. 1–3. In particular, a typical 8-block memory array structure comprising one bank 2 in a DRAM, an X-decoder 4, and a Y-decoder 6 is illustrated in FIG. 1. Here, the X-decoder 4 and the Y-decoder 6 are configured to provide a signal such as row address and column address for controlling the active state of cells contained in each block.

As shown in FIG. 1, I, J and K are block selecting address, and each block is prepared with a certain number of redundant row/column repair lines for salvaging the defective cell. However, there is a limitation on the amount of cells in one block that may be salvaged by repair. Thus, it is necessary to use repair lines of an adjacent block to increase the repair efficiency.

Further, the adjacent block indicates one of a pair of blocks whose block address bit I and K are identical and which is selected by block address bit J. In this case, an adjacent block selecting signal SELF_PAIRb<0:7> determines which repair line to use among repair lines of the pair of blocks. This adjacent block selecting signal SELF_PAIRb<0:7>, as an output signal from a row fuse box (not shown), is determined based on cut state of a fuse within the row fuse box.

In other words, if the adjacent block selecting signal SELF_PAIRb<i> (i=0–7) is at a high level, the repair lines corresponding to an externally inputted block address are used for repair, or if the adjacent block selecting signal SELF_PAIRb<i> is at a low level, the repair lines of an adjacent block of a block corresponding to an externally inputted block address is used for the repair.

For example, in a case where all row repair lines of block 0 have been put into use, if an additional row repair for block 0 is needed, the adjacent block selecting signal SELF_PAIRb is provided at a low level in order to use row repair lines of block 2. Thus, even though the block address (e.g., [000]) corresponding to block 0 is inputted, the row repair lines of block 2 are selected by the adjacent block selecting signal SELF_PAIRb<0>.

Because a column repair method also has block address information, the defective column is replaced by a column repair line if any one of columns in a selected block is defective. However, in the conventional repair method for sharing row repair lines of an adjacent block, there is a problem if a column repair state is not considered when a row repair is performed by using the row repair lines of the adjacent block.

In the conventional repair method for sharing rowrepair lines of an adjacent block, a column repair circuit without considering a column repair state is further explained with reference to FIGS. 2 and 3. FIG. 2 is a circuit diagram illustrating a conventional column repair circuit without considering a column repair state in the conventional repair method for sharing row repair lines of an adjacent block. The column repair circuit includes a column redundancy fuse unit 20, a column redundancy decoding unit 30 and a column redundancy determining unit 40.

Here, the column redundancy fuse unit 20 receives a column redundancy start signal YREDST and block address RAT<9:11> and inverted block address RAB<9:11>, and generates column address control signals YES<1:7> and an initializing signal YFJB of the column address control signal. Each bit of block address RAT <9:11> is corresponding to block address K, J, I in FIG. 1. RAB<9:11> is generated by inverting signal level of each bit of RAT<9:11>.

The column redundancy decoding unit 30 decodes column address BYAC<1:7> in response to the column address control signals YFS<1:7> and the initializing signal YFJB of the column address control signal, and generates decoded column address YAJ<1:7>. The column redundancy determining unit 40 generates a column redundancy signal YREDC for column repair based on the decoded column address YAJ<1:7>.

In the column repair circuit, a column repair state is not reflected during a row repair because externally inputted block address RAT<9:11> and RAB<9:11> are inputted into the column repair circuit as they are (i.e., not inverted). As a result, a defect in a column cannot be detected.

Referring to FIG. 3, for example, assuming that a defective column of block 2 is repaired and the row repair of block 0 is performed by using an adjacent block 2 which is an adjacent block, it is necessary to reflect a column defect state for row repair lines of block 2 selected for the row repair of block 0 during the repair. In other words, a defective column of the row repair lines of block 2 needs to be replaced by a column repair line to repair a column defect for the row repair lines of block 2.

When the adjacent block selecting signal SELF_PAIRb<0> is a high level, row repair lines of the block designated by the inputted block address [000] (i.e., row repair lines of block 0) is used, thereby causing no problem. However, when the adjacent block selecting signal SELF_PAIRb<0> is a low level, the row repair lines of the adjacent block(block 2) is used. But, because the inputted block address is a block address [000] corresponding to block 0, not a block address [010] corresponding to block 2, a defect state of block 2 is not detected. Hence, a column defect state is not reflected during the row repair by using the row repair lines of the adjacent block.

SUMMARY OF THE DISCLOSURE

One aspect of the present disclosure is to improve the repair efficiency of a semiconductor memory device by repairing a defective column according to a column defect state when a defect is present in a column of the row repair lines of the adjacent block selected for row repair, in a semiconductor memory device or sharing row repair lines of an adjacent block.

According to one aspect of the present disclosure, there is provided a circuit for repairing a column in a semiconductor memory device comprising an adjacent block selecting fuse circuit for generating an adjacent block selecting signal in response to a column redundancy start signal, the adjacent block selecting signal determining whether to use row repair lines of a block designated by an externally inputted block address or row repair lines of an adjacent block of the block. A column redundancy fuse circuit receives the adjacent block selecting signal, the block address, an inverted block address, and the column redundancy start signal, and generates a plurality of column address control signals and initializing signal of the column address control signal. A column redundancy decoding circuit decodes column address in response to the initializing signal and the plurality of column address control signals, and generates decoded column address. A column redundancy determining circuit generates a column redundancy signal based on the decoded column address. The column redundancy fuse unit includes an address transmission unit to transmit an adjacent block designating bit designating the adjacent block among the block address and an inverted adjacent block designating bit designating the adjacent block among the inverted block address in response to the adjacent block selecting signal.

According to another aspect of the present disclosure, there is provided a method for repairing a column in a semiconductor memory device, which comprises the steps of: generating an adjacent block selecting signal in response to a column redundancy start signal, the adjacent block selecting signal determining whether to use row repair lines of a block designated by an externally inputted block address or row repair lines of an adjacent block of the block; transmitting an adjacent block designating bit for designating the adjacent block among the block address and an inverted adjacent block designating bit for designating the adjacent block among an inverted block address in response to the adjacent block selecting signal; generating a plurality of column address control signals and an initializing signal of the column address control signal in response to the column redundancy start signal, the adjacent block designating bit, the inverted adjacent block designating bit, and a plurality of bit in which the adjacent block designating bit and the inverted adjacent block designating bit are removed form the block address and the inverted block address; generating decoded column address by decoding the initializing signal, the column address control signal and one bit of column address; and repairing a defective column by generating a column redundancy signal in response to decoded column address.

DETAILED DESCRIPTION OF THE EXAMPLES

Figure 1:
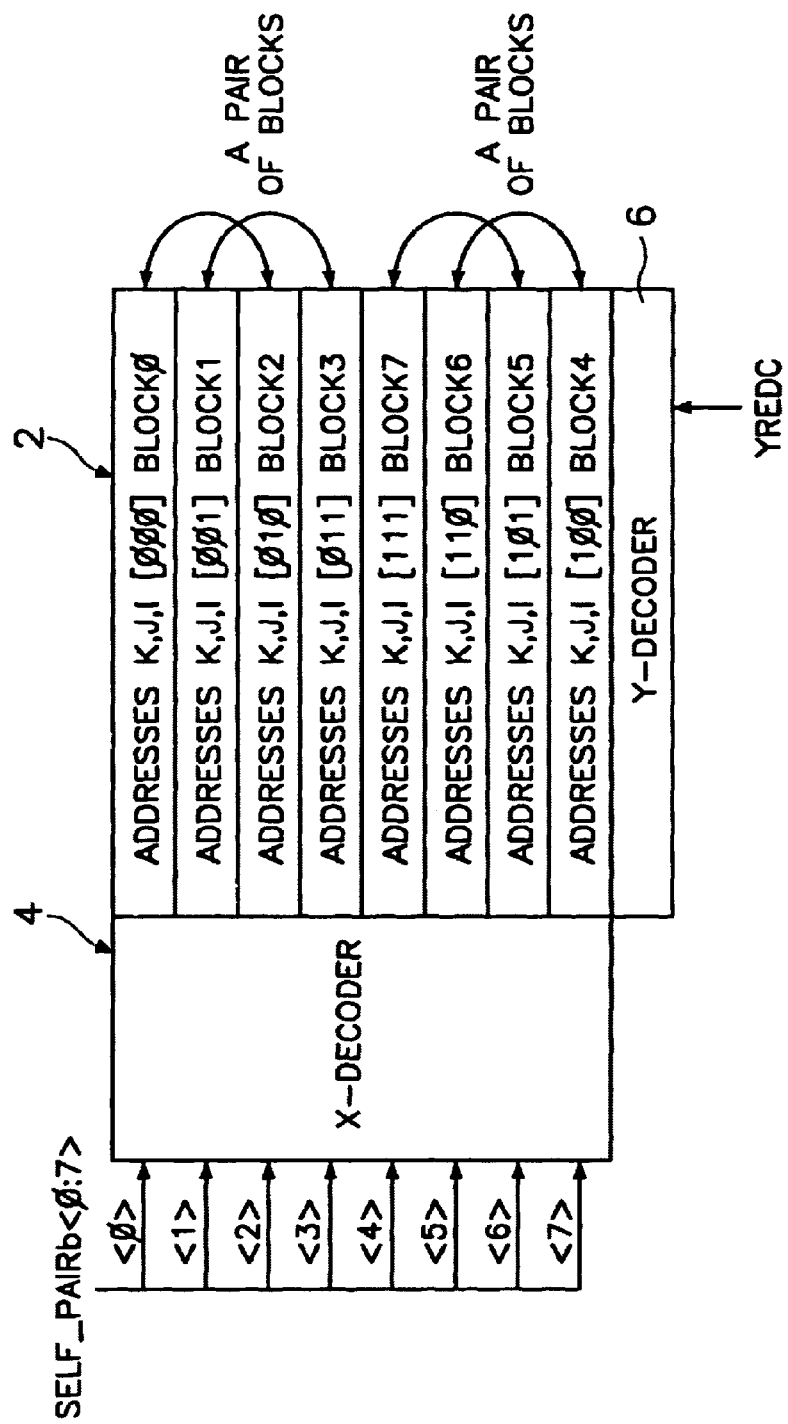
FIG. 1 is a block diagram illustrating a general block structure of one bank of a conventional semiconductor memory device.
Figure 2:
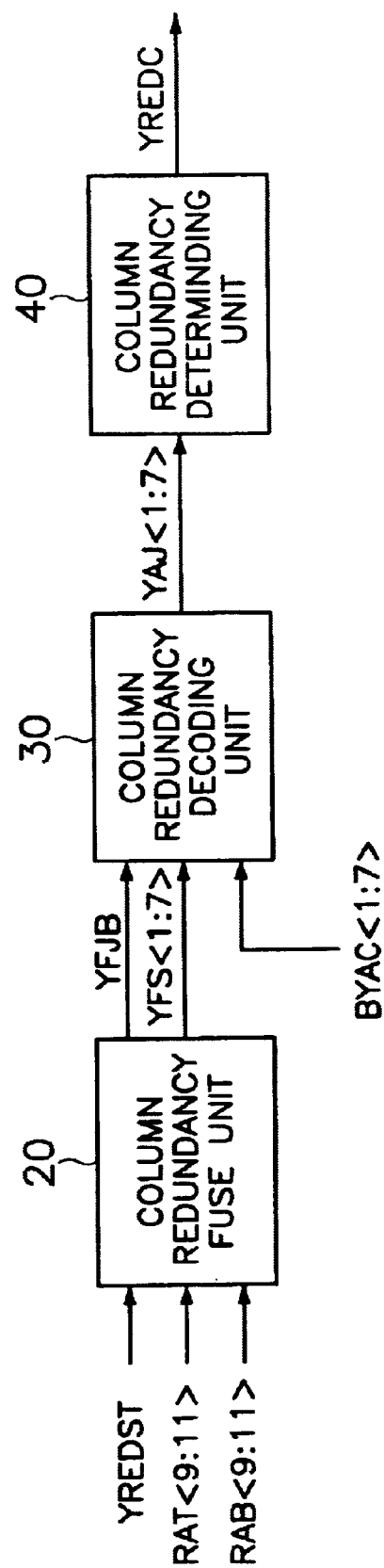
FIG. 2 is a block diagram illustrating a conventional column repair circuit.
Figure 3:
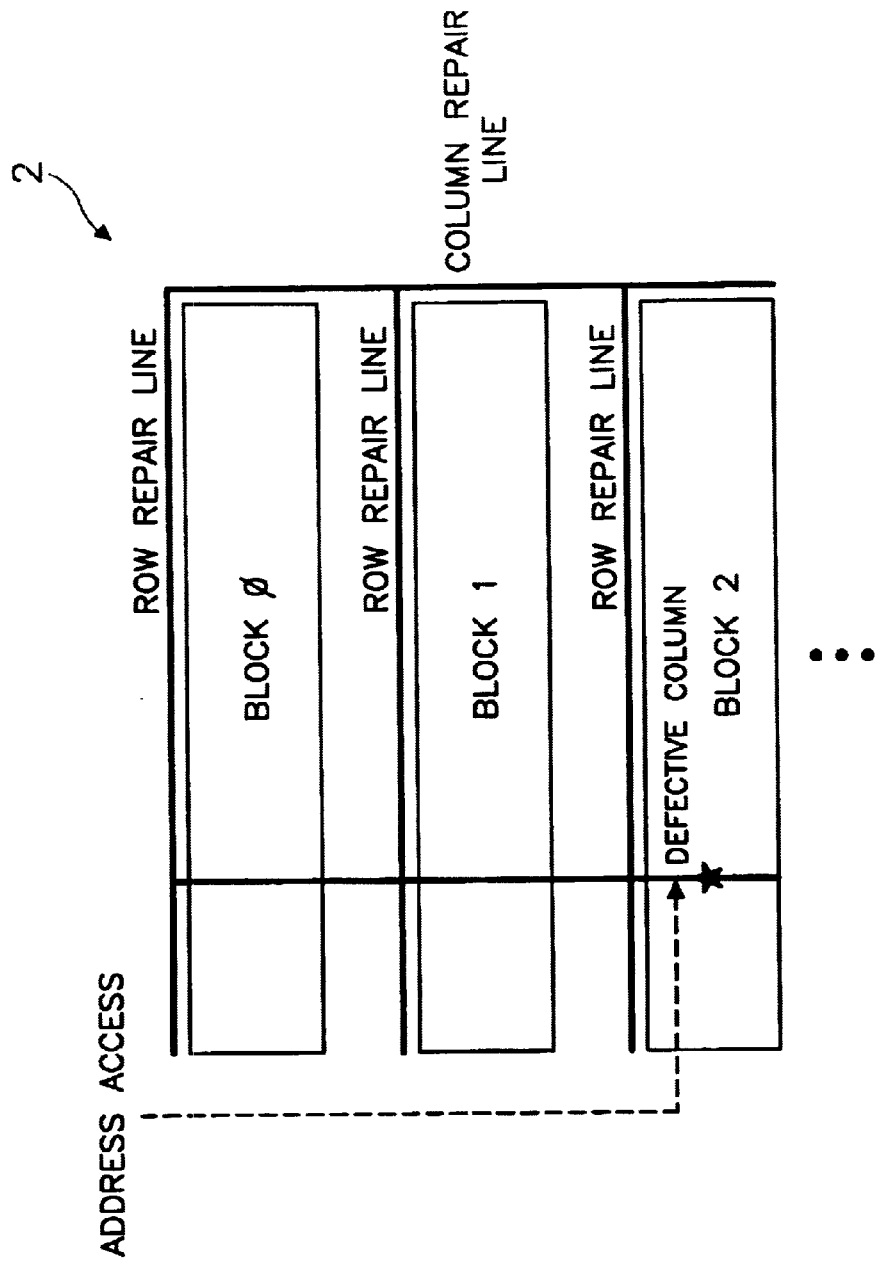
FIG. 3 is a block diagram illustrating a column defect state of the conventional column repair circuit as shown in FIG. 2.
Figure 4:
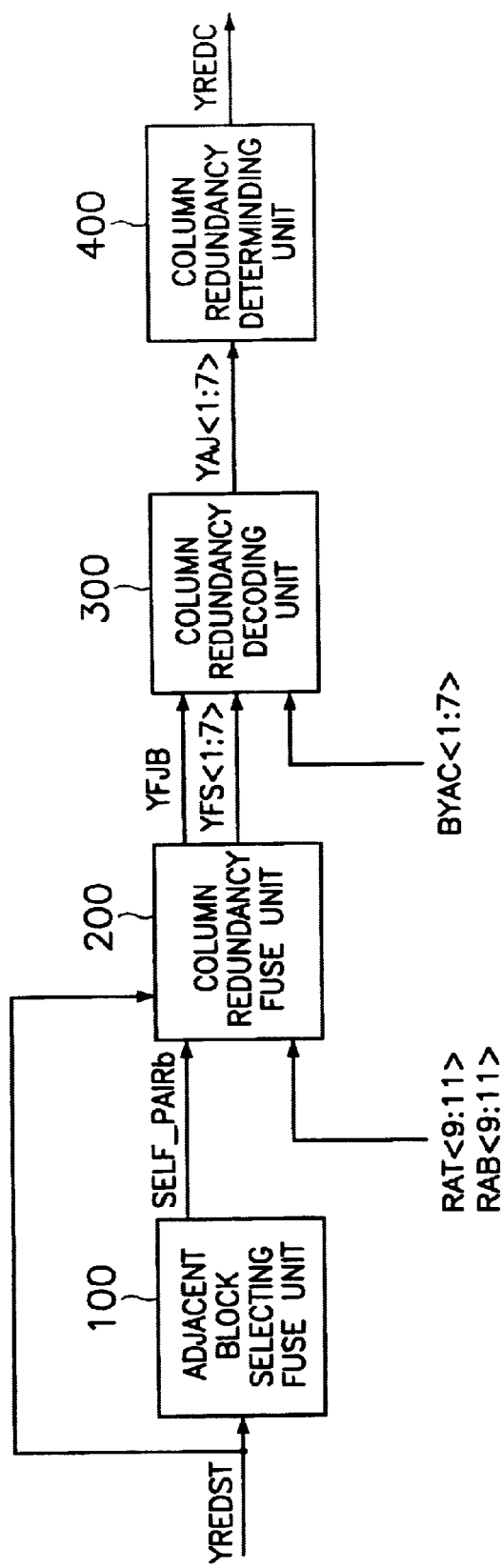
FIG. 4 is a block diagram illustrating a circuit for repairing a column in a semiconductor memory device constructed in accordance with the teachings of the present invention.

Hereinafter, devices constructed in accordance with the teachings of the present disclosure will be described in detail with reference to the accompanying drawings. Referring to FIG. 4, a column repair circuit includes an adjacent block selecting fuse unit 100, a column redundancy fuse unit 200, a column redundancy decoding unit 300 and a column redundancy determining unit 400.

The adjacent block selecting fuse unit 100 receives a column redundancy start signal YREDST, and generates an adjacent block selecting signal SELF_PAIRb. The adjacent block selecting signal SELF_PAIRb determines whether to use either row repair lines of the block designated by an externally inputted block address or row repair lines of an adjacent block.

The column redundancy fuse unit 200 transmits an externally inputted block address bit RAT<10> and an inverted block address bit RAB<10> which is an inverted signal of RAT<10> as it is when the adjacent block selecting signal SELF_PAIRb is at a high level. The column redundancy fuse unit 200 exchanges the block address bit RAT<10> with inverted block adress bit RAB<10> and transmits them when the adjacent block selecting signal SELF_PAIRb is a low level. The column redundancy fuse unit 200 also generates column address control signals YFS<1:7> and an initializing signal YFJB of the column address control signal by using the block address bit RAT<10>, the inverted block address bit RAB<10>, the column redundancy start signal YREDST, block address bit RAT<9>, RAT<11>, and inverted block address bit RAB<9>, RAB<11>.

The column redundancy decoding unit 300 decodes column address BYAC<1:7> in response to the column address control signals YFS<1:7> and the initializing signal YFJB of the column address control signal and, and generates decoded column address YAC<1:7>.

The column redundancy determining unit 400 generates a column redundancy signal YREDC for column repair based on the decoded column address YAJ<1:7>.

Figure 5:
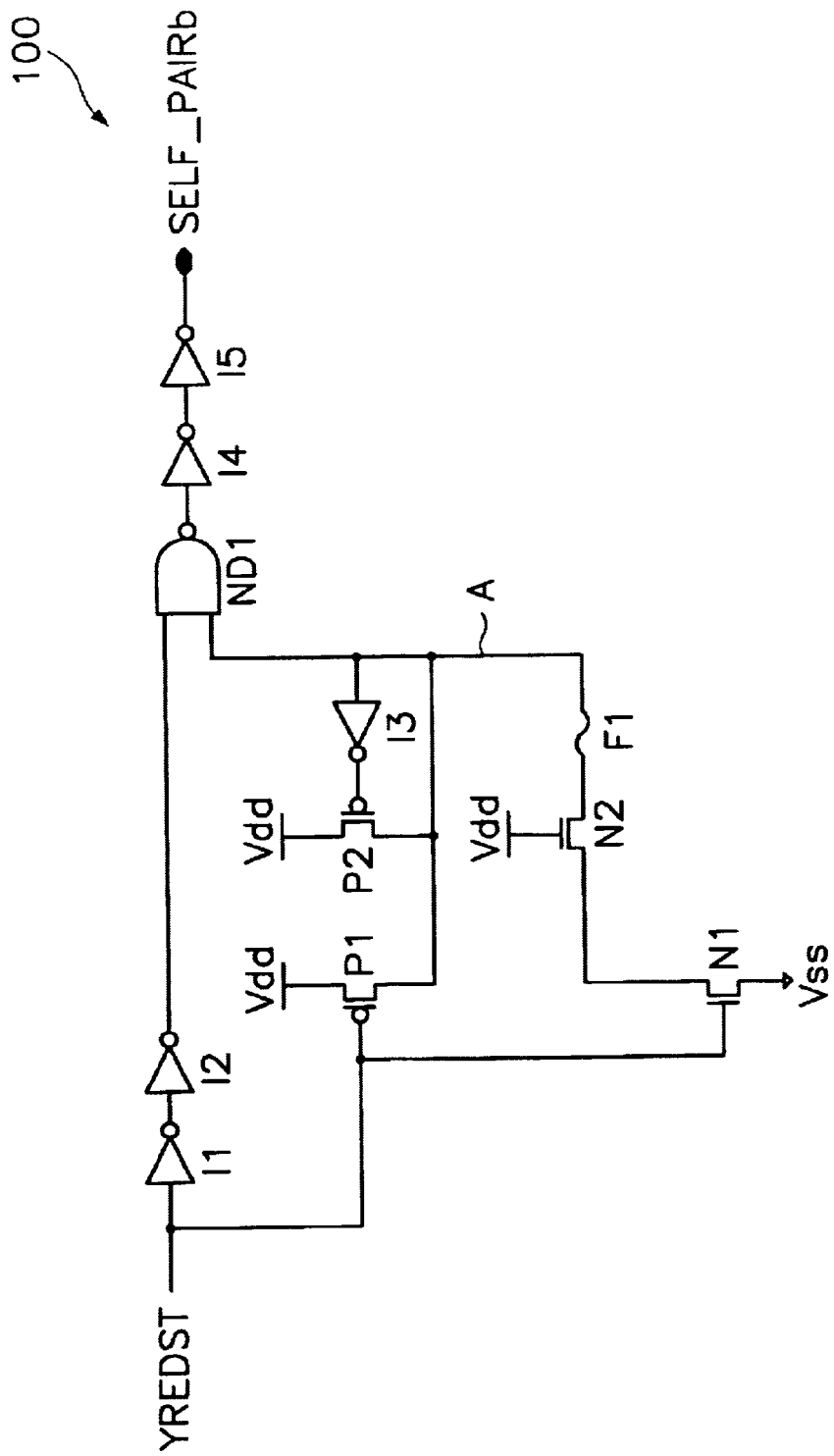
FIG. 5 is a circuit diagram of an adjacent block selecting fuse unit of FIG. 4.

Referring to FIG. 5, the illustrated adjacent block selecting fuse unit 100 includes inverters I1, I2, I3, I4 and I5 (i.e., a first inverter I1, a second inverter I2, etc.), PMOS transistors P1 and P2 (i.e., a first PMOS transistor P1, etc.), NMOS transistors N1 and N2 (i.e., a first NMOS transistor N1, etc.), a NAND gate ND1, and a fuse F1. The PMOS transistor P1 includes a source connected to a power voltage Vdd, and a drain connected to a node A. A column redundancy start signal YREDST is applied to a gate of the PMOS transistor P1. The inverter I3 inverts a signal of the node A. The PMOS transistor P2 includes a source connected to the power voltage Vdd, and a drain connected to the node A. An output signal of an inverter I3 is applied to a gate of the PMOS transistor P2. The NMOS transistor N1 includes a source connected to a ground voltage Vss. The column redundancy start signal YREDST is applied to a gate of the NMOS transistor N1. The NMOS transistor N2 includes a source connected to a drain of the NMOS transistor N1. The power voltage Vdd is applied to a gate of the NMOS transistor N2. The fuse F1 is connected between the drain of the NMOS transistor N2 and the node A. Inverters I1 and I2 buffer the column redundancy start signal YREDST, which is enabled to a high level in a row active state. The NAND gate ND1 logically combines an output signal of the inverter I2 and the signal of the node A. Inverters I4 and I5 buffer an output signal of the NAND gate ND1 to output an adjacent block selecting signal SELF_PAIRb.

Next, the operation of the above-described adjacent block selecting fuse unit 100 will be described with reference to FIG. 5. The column redundancy start signal YREDST is enabled to a high level in a row active state. When column redundancy start signal YREDST is at a low level, an input of NAND gate ND1 becomes a low level, and thus the adjacent block selecting signal SELF_PAIRb is enabled to a high level regardless of whether a fuse F1 is cut or not. Thereby, the column redundancy signal YREDC that is described in detail below, is at a low level in its initial state and thus a main column decoder (not shown) is enabled. At this time, the node A becomes at a high level by turning on PMOS transistor P1.

If the fuse F1 is not cut and the column redundant start signal YREDST is at a high level, in a row active state a discharge path to the NMOS transistor N1 is formed and thus the adjacent block selecting signal SELF_PAIRb becomes a high level. As a result, row repair lines of the block designated by the inputted block address are used.

In contrast, if the fuse F1 is cut, in the row active the discharge path to the NMOS transistor N1 is disconnected and thus the adjacent block selecting signal SELF_PAIRb becomes a low level. As a result, row repair lines of the adjacent block are used.

That is, it is possible to determine whether or not use row repair lines of the adjacent block according to cut state of the fuse F1.

Figure 6:
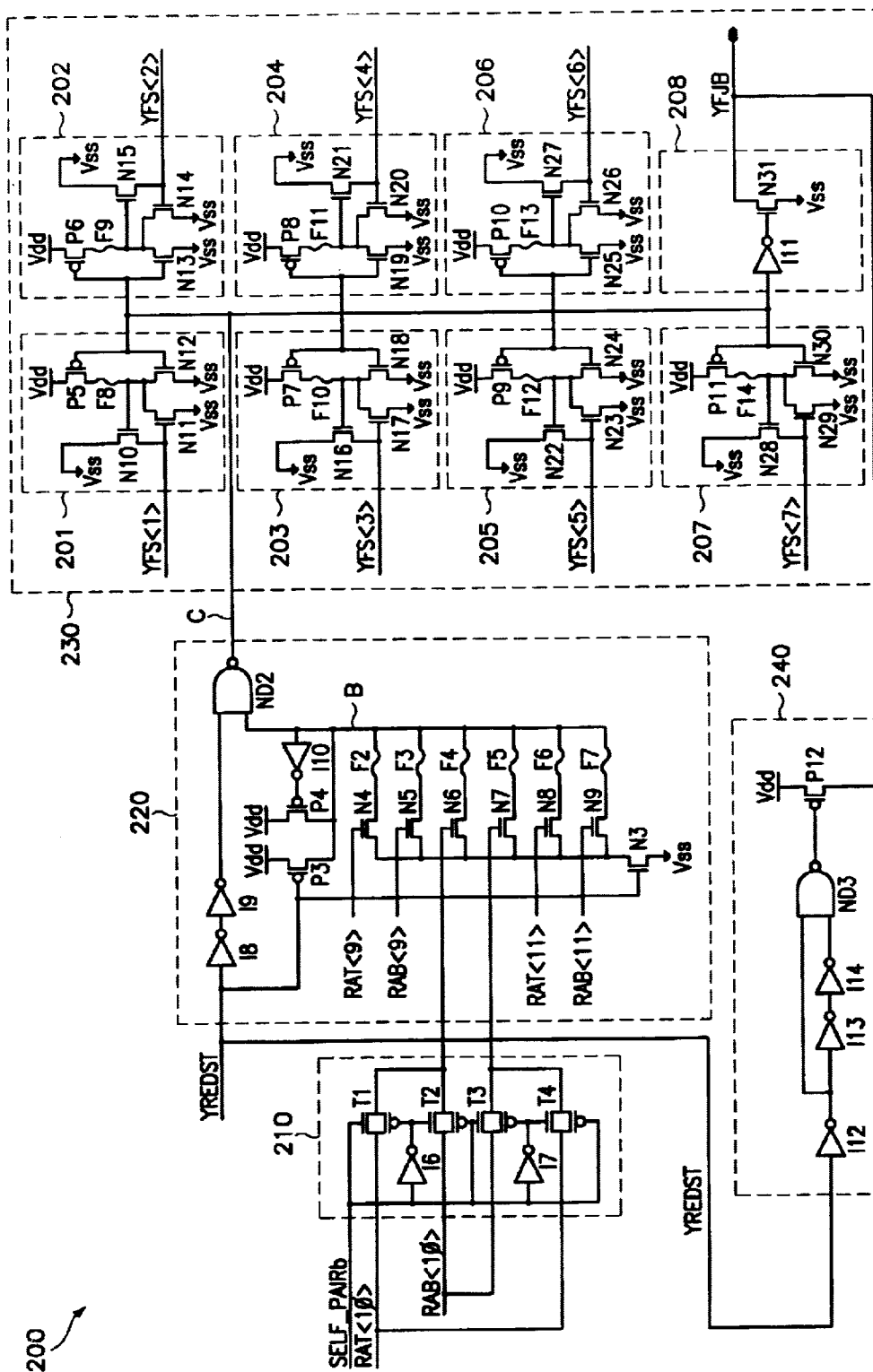
FIG. 6 is a circuit diagram of a column redundancy fuse unit of FIG. 4.

Referring to FIG. 6, the column redundancy fuse unit 200 includes an address transmission unit 210, a fuse unit 220, a control signal generating unit 230, and an initializing signal generating unit 240.

Further, RAT<9:11> represents an externally inputted block address in a row active state, and RAB<9:11> represents an inverted signal of the block address RAT<9:11>. YREDST represents a column redundancy start signal that is enabled to a high level in the row active state. YFJB represents an initialization signal of the column redundancy control signal that is precharged to a high level by the column redundancy start signal YREDST of a low level in its initial state.

In the address transmission unit 210, the inverters I6 and I7 invert the adjacent block selecting signal SELF_PAIRb. Transmission gates T1, T2, T3 and T4 transmit an adjacent block designating bit(J-block address bit) RAT<10> for designating an adjacent block or an inverted adjacent block designating bit RAB<10> under the control of the adjacent block selecting signal SELF_PAIRb and output signals of the inverters I6 and I7.

The address transmission unit 210 transmits an externally inputted block address bit RAT<10> to a gate of NMOS transistors N6 and transmits an inverted block address bit RAB<10> to gate of NMOS transistor N7 if the adjacent block selecting signal SELF_PAIRb is at a high level. In contrast, the address transmission unit 210 transmits the externally inputted block address bit RAT<10> to the gate of NMOS transistor N7 and transmits the inverted block address bit RAB<10> to the gate of NMOS transistor N6 if the adjacent block selecting signal SELF_PAIRb is at a low level.

The fuse unit 220 receives an output signal of the address transmission unit 210, the column redundancy start signal YREDST, and K and I block address bit RAT<9>, RAT<11> and inverted K and I block address bit RAB<10>, RAB<11> and determines an output signal of the control signal generating unit 230 by fuse F2–F7 that are cut according to row repair and column repair.

In the fuse unit 220, the inverters I8 and I9 buffer the column redundancy start signal YREDST. The PMOS transistor P3 includes a source connected to a power voltage Vdd, and a drain connected to a node B. The column redundancy start signal YREDST is applied to a gate of the PMOS transistor P3. The inverter I10 inverts a signal of the node B. The PMOS transistor P4 includes a source connected to the power voltage Vdd, and a drain connected to the node B. An output signal of the inverter I10 is applied to a gate of the PMOS transistor P4. The NMOS transistor N3 includes a source connected with the ground voltage Vss. The column redundancy start signal YREDST is applied to a gate of the NMOS transistor N3. The NMOS transistor N4 includes a source connected with a drain of the NMOS transistor N3. The block address bit RAT<9> is applied to a gate of the NMOS transistor N4. The fuse F2 is connected between a drain of the NMOS transistor N4 and the node B. The NMOS transistor N5 includes a source connected to the drain of the NMOS transistor N3. The inverted block address bit RAB<9> is applied to a gate of the NMOS transistor N5. The fuse F3 is connected between, a drain of the NMOS transistor N5 and the node B. The NMOS transistor N6 includes a source connected to the drain of the NMOS transistor N3. One of output signals of the transmission gates T1 and T2 is applied to a gate of the NMOS transistor N6. The fuse F4 is connected between a drain of the NMOS transistor N6 and the node B. The NMOS transistor N7 includes a source connected with the drain of the NMOS transistor N3. One of output signals of the transmission gates T3 and T4 is applied to a gate of the NMOS transistor N7. The fuse F5 is connected between a drain of the NMOS transistor N7 and the node B. The NMOS transistor N8 includes a source connected with the drain of the NMOS transistor N3. The block address bit RAT<11> is applied to a gate of the NMOS transistor N8. The fuse F6 is connected between a drain of the NMOS transistor N8 and the node B. The NMOS transistor N9 includes a source connected with the drain of the NMOS transistor N3. The inverted block address bit RAB<11> is applied to a gate of the NMOS transistor N9. The fuse F7 is connected between a drain of the NMOS transistor N9 and the node B. The NAND gate ND2 logically combines an output signal of the inverter I9 and a signal of the node B.

The control signal generating unit 230 includes a plurality of column address control signal generating unit 201–207 for generating a plurality of column address control signals YFS<1:7> in response to an output signal of the fuse unit 220, and a column address initializing signal generating unit 208 for generating an initializing signal YFJB of the column address control signal.

When the initializing signal generating unit 240 receives the column redundancy start signal YREDST of a low level, the initializing signal YFJB of the column address control signals is precharged to a high level in its initial state.

In the column address control signal generating unit 201, a PMOS transistor P5 has a source connected to a power voltage Vdd. A signal of a node C is applied to gate of the PMOS transistor P5. The NMOS transistor N12 includes a source connected with a ground voltage Vss. The signal of the node C is applied to a gate of the NMOS transistor N12. The fuse F8 is connected between a drain of the PMOS transistor P5 and a drain of the NMOS transistor N12. The NMOS transistor N11 includes a source connected with the ground voltage Vss. The column address control signal YFS<1> is applied to a gate of the NMOS transistor N11. A drain of the NMOS transistor 11 is connected to a common contact point of the fuse F8 and the NMOS transistor N12. The NMOS transistor N10 includes a source connected with the ground voltage Vss. A drain of the NMOS transistor N10 is connected with the gate of the NMOS transistor N11. A gate of the NMOS transistor N10 is connected to the common contact point of the fuse F8 and the NMOS transistors N11 and N12.

Each of the remaining column address control signal generating units 202–207 has a similar structure as the above-described column address control signal generating unit 201. The column address initializing signal generating unit 208 includes an inverter I11 for inverting the signal of the node C and an NMOS transistor N31 including a source connected with the ground voltage Vss. An output signal of the inverter I11 is applied to a gate of the NMOS transistor N31.

In the initializing signal generating unit 240, the inverter I12 inverts the column redundancy start signal YREDST. Inverters I13 and I14 continuously invert an output signal of the inverter I12. The NAND gate ND3 logically combines the output signal of the inverter I12 and an output signal of the inverter I14. The PMOS transistor P12 has a source connected to the power voltage Vdd and a drain connected to a drain of the NMOS transistor N31 in the column address initializing signal generating unit 208. An output signal of the NAND gate ND3 is applied to each gate of the PMOS transistor P12.

When the column redundancy fuse unit 200 receives the adjacent block selecting signal SELF_PAIRb of a high level, it is necessary to use row repair lines of the block designated by, an block address bit RAT<10>. Thus, the block address bit RAT<10> is inputted to a gate of an NMOS transistor N6, and the inverted block address bit RAB<10> is inputted to a gate of an NMOS transistor N7. In contrast, if the adjacent block selecting signal SELF_PAIRb is at a low level, it is necessary to use row repair lines of block pair of the block designated by the block address bit RAT<10>. Thus, the inverted block address bit RAB<10> is inputted to the gate of the NMOS transistor N6, and the block address bit RAT<10> is inputted to a gate of the NMOS transistor N7.

That is, the method for sharing row repair lines between adjacent blocks determines whether or not to automatically exchanges an externally inputted block address bit RAT<10> and an inverted block address bit RAB<10> in the rows active state according to the level of the adjacent block selecting signal SELF_PAIRb. Thereby, even when using row repair lines of the adjacent block, a column defect is detected and thus a defective column is replaced with a column repair line. Accordingly, it is possible to improve the repair efficiency.

Next, the operation of the column redundancy fuse unit 200 will be described in more detail with reference to FIG. 6.

Fuses F2–F7 of the fuse unit 220 and fuses F8–F14 of the control signal generating unit 230 are cut corresponding to defective block address RAT<9:10> and defective column address BYA<1:7>, respectively. The fuses F2, F4, F6 correspond to the block address bit RAT<9>, RAT<10>, RAT<11>, respectively. The fuses F3, F5, F7 correspond to the inverted block address bit RAB<9>, RAB<10>, RAB<11>, respectively. The fuses are cut corresponding to each bit of a high level among the defective block address RAT<9:11> and the inverted block address RAB<9:11>. For example, when the block address RAT<9:11> is [010], RAB<9:11> becomes [101]. Thereby, only fuses F3, F4, F7 are cut. Also, fuses F8–F14 correspond to the column address bit BYAC<1>–BYAC<7>, respectively. The fuses F8–F14 are cut corresponding to each bit of a low level among defective column address BYAC<1:7>. For example, when the defective column address BYAC<1:7> is [00011111], only fuses F8–F10 are cut.

In a case that SELF_PAIRb is at a low level and the row repair lines of the adjacent block are used, if the externally inputted block address RAT<9:11> is not an adjacent block address of the defective block, at least one of the address bit corresponding to an uncut fuse of the fuse unit 220 is at a high level. Thus, if the column redundant start signal YREDST becomes a high level, any of transistors N3–N9 is turned on. Then, the node B becomes a low level and the node C becomes a high level. As a result, NMOS transistors N12, N13, N18, N19, N24, N25 and N30 are turned on, and NMOS transistors N10, N15, N16, N21, N22, N27 and N28 for discharging the column address control signals YFS<1:7> are turned off. Thus, the column address control signals YFS<1:7> remains a high level of an initial state.

That is, the column address control signal YFS<1:7> remains charged to a high level regardless of whether column address fuses F8–F14 of the control signal generating unit 230 is cut or not. Thus, a NMOS transistor N31 is turned off because the node C is at a high level. Thus, the initializing signal YFJB of the column address control signal remains a high level of an initial state.

In a case with SELF_PAIRb at a low level and the row repair lines of the adjacent block used, if the externally inputted block address RAT<9:11> is an adjacent block address of the defective block, a gate input of the NMOS transistor connected to the uncut fuse among the NMOS transistors N4–N9 is at a low level, and a gate input of the NMOS transistor connected to the cut fuse is at a high level. Accordingly, even when the column redundant start signal YREDST is at a high level, a discharge path to the NMOS transistor N3 shown in FIG. 6 is disconnected. As a result, the node B maintains a high level of the initial state, and the node C becomes a low level. At this time, the NMOS transistor N31 is turned off, and the initializing signal YFJB of the column address control signal is discharged to the ground to be a low level.

In this case, the output of the column address control signal YFS<1:7> is different according to the cut state of column fuses F8–F14. If the inputted column address BYAC<1:7> is not a column address for column repair, that is, unless an address bit corresponding to an uncut fuse among fuses F8–F14 is an address bit of a high level, a PMOS transistor connected to an uncut fuse among PMOS transistors P5–P11 is turned on. Further, an NMOS transistor connected to the uncut fuse among NMOS transistors N10, N15, N16, N21, N22, N27 and N28 is turned on. Thereby, the column address control signal YFS<i> corresponding to the uncut fuse becomes a low level.

On the contrary, when the inputted column address BYAC<1:7> is a column address for column repair, that is if an address bit corresponding to the cut fuse among the fuses F8–F14 is an address bit of a high level, a NMOS transistor connected to the cut fuse among NMOS transistors N10, N15, N16, N21, N22, N27 and N28 is not turned on. There by, the column address control signal YFS<i> is charged to a high level.

Figure 7:
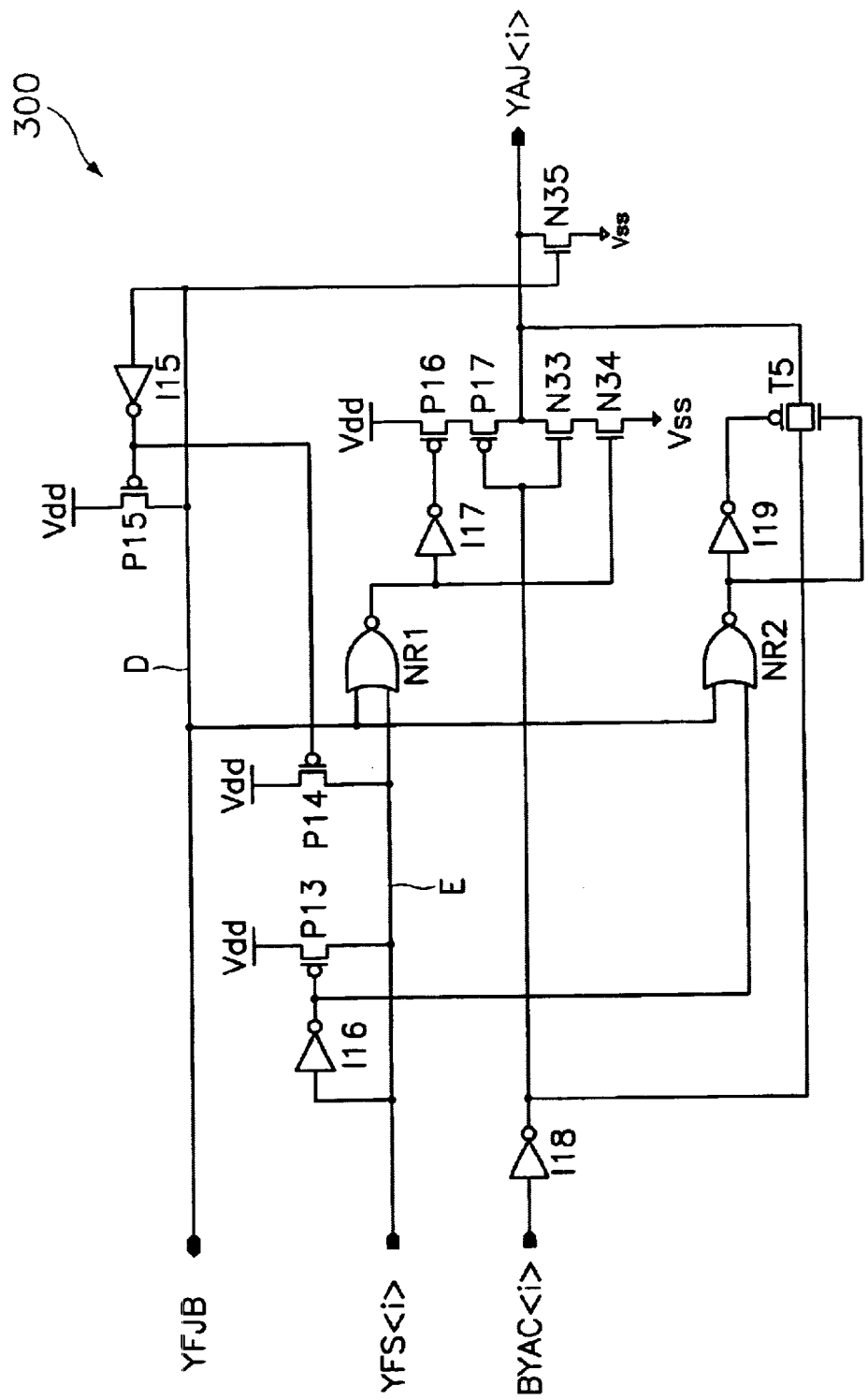
FIG. 7 is a circuit diagram of a column redundancy decoding unit of FIG. 4.

Referring to FIG. 7, the column redundancy decoding unit 300 includes inverters I15, I16, I17, I18, and I19, PMOS transistors P13, P14, P15, P16, and P17, NMOS transistors N33, N34, and N35, and NOR gates NR1 and NR2. The inverter I16 inverts a column address control signal YFS<i>. The PMOS transistor P13 includes a source connected to a power voltage Vdd and a drain connected a node E. An output signal of the inverter I16 is applied to a gate of the PMOS transistor P13. The inverter I15 inverts an initializing signal YFJB of the column address control signal. The PMOS transistor P15 includes a source connected to the power voltage Vdd a drain connected to the node C. An output signal of the inverter I15 is applied to a gate of the PMOS transistor P15. The PMOS transistor P14 includes a source connected to the power voltage Vdd a drain connected to the node E. The output signal of the inverter I15 is applied to a gate of the PMOS transistor P15. The NOR gate NR1 logically combines the initializing signal YFJB of the column address control signal and the column address control signal YFS<i>. The NOR gate NR2 logically combines the initializing signal YFJB of the column address control signal and the output signal of the inverter I16. The inverter I17 inverts an output signal of the NOR gate NR1. The inverter I18 inverts a column address bit BYAC<i>. The PMOS transistors P16 and P17 and the NMOS transistors N33 and N34 are connected in series between the power voltage Vdd and the ground voltage Vss. An output signal of the inverter I17 is applied to a gate of the PMOS transistor P16. An output signal of the inverter I18 is applied to each gate of the PMOS transistor P17 and NMOS transistor and N33. The output signal of the NOR gate NR1 is applied to a gate of the NMOS transistor N34. The inverter I19 inverts an output signal of the NOR gate NR2. A transmission gate T5 transmits the output signal of the inverter I18 under the control of an output signal of the inverter I19 and the output signal of the NOR gate NR2. The NMOS transistor N35 includes a source connected to the ground voltage Vss a drain connected to an output terminal of the decoded column address bit YAJ<i>. The initializing signal YFJB of the column address control signal is applied to a gate of the NMOS transistor 35.

Figure 8:
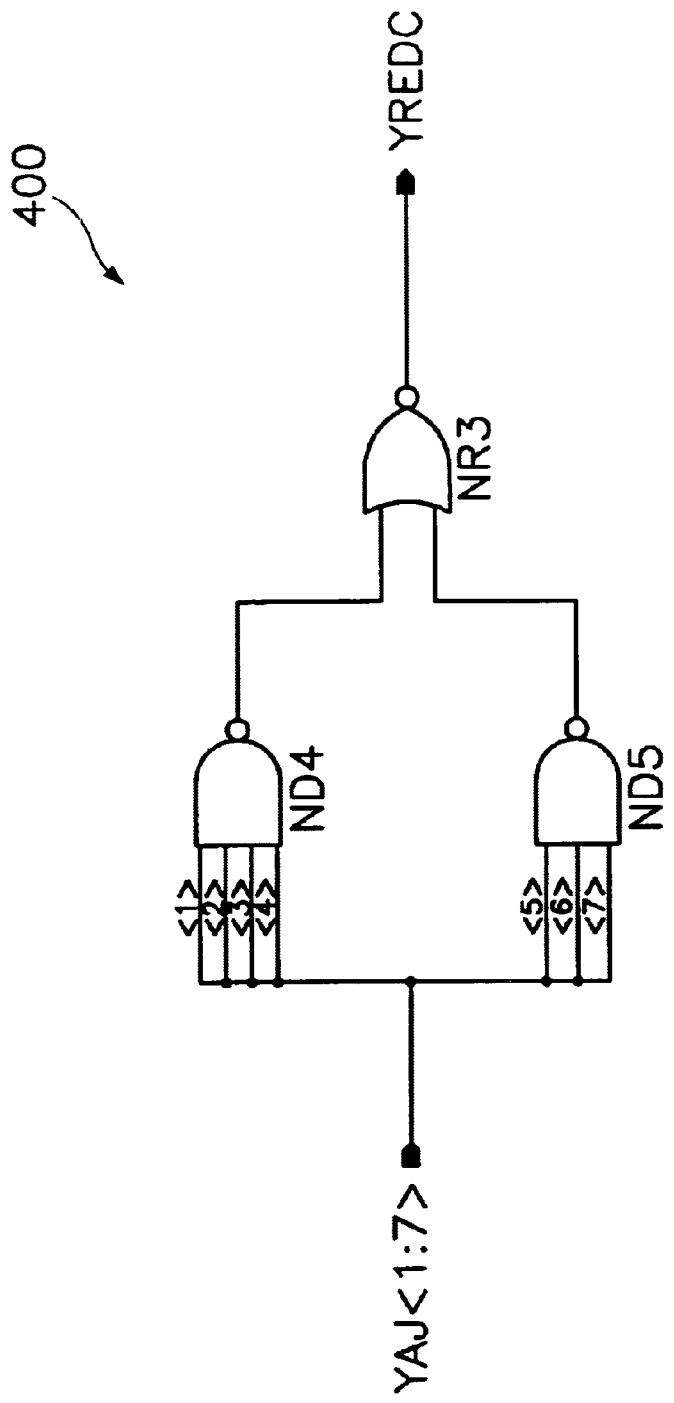
FIG. 8 is a circuit diagram of a column redundancy determining unit of FIG. 4.

Referring to FIG. 8, the column redundancy determining unit 400 includes NAND gates ND4 and ND5 and a NOR gate NR3.

In the column redundancy determining unit 400, the NAND gates ND4 and ND5 logically combine the decoded column address YAJ<1:7>. The NOR gate NR3 logically combines output signals of the NAND gates ND4 and ND5, and outputs a column redundancy signal YREDC.

Referring back to FIG. 6, unless an externally inputted block address RAT<9:11> is an adjacent block address of the defective block, that is, an address corresponding to the cut state of the fuses F2, F5 and F6(when fuse is cut, address bit=1, and when fuse is not cut, address bit=0), the node B becomes a low level and the node C becomes a high level. Then, the initializing signal YFJB of the column address control signal having a high level is inputted to the NOR gates NR1 and NR2, and thus, output level of the NOR gate NR1 and NR2 become a low level regardless of the level of the column address control signal YFS<i> and the column address bit BYAC<i>. At this time, the NMOS transistor N35 is turned on and a decoded column address bit YAJ<i> becomes a low level. Next, each bit of the decoded column address YAJ<1:7> is inputted at a low level into the column redundancy determining unit 400 as illustrated in FIG. 8, and thus a column redundancy signal YREDC becomes a low level.

In this case, the column redundancy signal YREDC becomes a low level, and a main column decoder (not shown) is enabled regardless of whether or not the inputted column address BYAC<1:7> is a defective address.

In contrast, if an externally inputted block address RAT<9:11> is an adjacent block address of the defective block, that is, an address corresponding to the cut sate of the fuses F2, F5 and F6, the column redundancy start signal YREDST is at a high level. Then, the node B becomes a high level and thus the node C becomes a low level. The initializing signal YFJB of the column address control signal is inputted at a low level to the NOR gates NR1 and NR2. Then, a level of the column address control signal YFS<i> determines whether the output signal of the NOR gate NR1 is made at a high level or the output signal of the NOR gate NR2 is made at a high level.

For example, if the externally inputted column address bit BYAC<i> is the defective column address, the fuse corresponding to the column address bit BYAC<i> of a low level among the fuse F8–F14 is cut, and the column address control signal YFS<i> becomes a high level. Then, an output signal of the NOR gate NR1 becomes a low level, and an output signal of the NOR gate NR2 becomes a high level. Thereby, the transmission gate T5 is turned on, and the decoded column address bit YAJ<i> becomes a high level regardless of the on/off of the transistors P16, P17, N33 and N34.

In contrast, if the fuse corresponding to the column address bit BYAC<i> of a high level among the fuse F8–F14 is not cut, the column address control signal YFS<i> becomes a low level. Then, the output signal of the NOR gate NR1 becomes a high level and the output signal of the NOR gate NR2 becomes a low level. Thereby, the transmission gate T5 and the NMOS transistor N33 are not turned and PMOS transistor P16 and P17 are turned on. Thus, the decoded column address bit YAJ<i> becomes a high level.

That is, if a defective column address corresponding to the cut state of fuses F8–F14 is inputted, the decoded column address bit YAJ<i> becomes a high level regardless of whether the column address bit BYAC<i> is at a low level or a high level. Accordingly, the column redundancy signal YREDC becomes a high level, and thus a repair column decoder (not shown) is enabled. As a result, a defective column is replaced by a column repair line.

Unless an externally inputted column address BYAC<1:7> is a defective column address, YFS<i> corresponding to the column address bit BYAC<i> of a low level becomes a low level, or YFS<i> corresponding to the column address bit BYAC<i> of a high level becomes a high level. That is, BYAC<i> and YFS<i> become at a high level or a low level.

Referring to FIG. 7, when YFJB is at a low level and BYAC<i> and YFS<i> are a high level, transmission gate T5 is turned on and then YAJ<i> becomes a low level. Also, when YFJB is at a low level and BYAC<i> and YFS<i> are a low level, NMOS transistors N33 and N34 are turned on and then YAJ<i> becomes a low level.

Accordingly, referring to FIG. 8, when at least one of YAJ<i> becomes a low level, YREDC becomes a low level except the output signals of NAND gate ND3 and ND4 become a low level. That is, unless a defective column address corresponding to the cut state of fuses F8–F14 is inputted, a main column decoder(not shown)is enabled.

As described above, in the repair method for sharing row repair lines of an adjacent block, if an adjacent block selecting signal is at a high level, row repair lines of the block designated by an externally inputted block address are used. If the adjacent block selecting signal is at a low level, row repair lines of an adjacent block are used by inverting an externally inputted block address. Thus, it is possible to improve repair efficiency of a semiconductor memory device by replacing a defective column with a column repair line.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A circuit for repairing a column in a semiconductor memory device, comprising:

an adjacent block selecting fuse circuit for generating an adjacent block selecting signal in response to a column redundancy start signal, the adjacent block selecting signal determining to use row repair lines of a block designated by an externally inputted block address or row repair lines of an adjacent block of the block;

a column redundancy fuse circuit for receiving the block address and an inverted block address in response to the adjacent block selecting signal and the column redundancy start signal, and generating a plurality of column address control signals and an initializing signal of the column address control signal;

a column redundancy decoding circuit for decoding a column address in response to the initializing signal and the plurality of column address control signals, and generating a decoded column address; and a column redundancy determining circuit for generating a column redundancy signal based on the decoded column address.

2. The circuit of claim 1, wherein the adjacent block selecting fuse circuit outputs the adjacent block selecting signal of high level when using the row repair lines of the block designated by the block address, and outputs the adjacent block selecting signal of low level when using the row repair lines of the adjacent block.

3. The circuit of claim 1, wherein the adjacent block selecting fuse circuit comprises:

a first buffer for buffering and outputting the column redundancy start signal;

a first transistor having a source connected to a power voltage, a drain connected to a first node, and a gate connected to receive the column redundancy start signal;

a second transistor having a source connected to the power voltage, a drain connected to the first node, a gate connected to receive an inverted signal of a signal of the first node;

a third transistor having a source connected to a ground voltage and a gate connected to receive the column redundancy start signal;

a fourth transistor having a source connected to a drain of the third transistor and a gate connected to a power voltage;

a fuse connected between a drain of the fourth transistor and the first node;

a logic device for logically combining an output signal of the first buffer and the signal of the first node; and a second buffer for buffering an output signal of the logic device and outputting the adjacent block selecting signal.

4. The circuit of claim 1, wherein the column redundancy fuse circuit comprises:

an address transmission unit for transmitting an adjacent block designating bit designating the adjacent block among the block address and the inverted adjacent block designating bit designating the adjacent block among the inverted block address when the adjacent block selecting signal is at a high level, and exchanging and transmitting the adjacent block designating bit with the inverted adjacent block designating bit when the adjacent block selecting signal is at a low level;

a fuse unit for receiving the column redundancy start signal, the adjacent block designating bit, the inverted adjacent block designating bit and a plurality block address bits in which the adjacent block designated bit and the inverted adjacent block designating bit are removed from the block address and the inverting block address, and outputting an output signal;

a control signal generating unit for generating the plurality of column address control signals in response to the output signal of the fuse unit, and generating the initializing signal when the column redundancy start signal is enabled; and an initializing signal generating unit for generating the initializing signal when the column redundancy start signal is disabled.

5. The circuit of claim 4, wherein the address transmission unit comprises a plurality of transmission gates for selectively transmitting the adjacent block designating bit and the inverted adjacent block designating bit under the control of the adjacent block selecting signal and an inverted signal of the adjacent block selecting signal.

6. The circuit of claim 4, wherein the fuse unit comprises:

first and second inverting devices for continuously inverting the column redundancy start signal;

a first transistor having a source connected to a power voltage, a drain connected to a first node, and a gate connected to receive the column redundancy start signal;

a second transistor having a source connected to a power voltage, a drain connected to the first node, and a gate connected to receive an inverted signal of a signal of the first node;

a set of transistors having each gate connected to respectively receive the adjacent block designating bit, the inverted adjacent block designating bit, and a plurality of bits in which the adjacent block designating bit and the inverted adjacent block designating bit are removed from the block address and the inverted block address;

a plurality of fuses respectively connected between one of the transistors in the set of transistors and the first node;

a third transistor having a source connected to a ground voltage, a drain connected to a common contact point of the set of transistors, and a gate connected to receive the column redundancy start signal; and a logic device for logically combining an output signal of the second inverting device and the signal of the first node.

7. The circuit of claim 4, wherein the control signal generating unit comprises:

a plurality of column address control signal generators for generating the plurality of column address control signals in response to an output signal of the fuse unit; and a column address initializing signal generator for generating the initializing signal in response to the output signal of the fuse unit.

8. The circuit of claim 4, wherein the initializing signal generating unit comprises:
    first, second, and third inverting devices for continuously inverting the column redundancy start signal;
    a logic device for logically combining an output signal of the first inverting device and an output signal of the third inverting device; and
    a transistor having a source connected to a power voltage, and a gate connected to receive an output signal of the logic device.

9. The circuit of claim 1, wherein the column redundancy decoding circuit comprises:
    a first transistor having a source connected to a power voltage, a drain connected to a first node, and a gate connected to receive an inverted signal of the initializing signal;
    a second transistor having a source connected to the power voltage, a drain connected to a second node, and a gate connected to receive an inverted signal of the column address control signal;
    a third transistor having a source connected to the power voltage, a drain connected to the second node, and a gate connected to receive the inverted signal of the initializing signal;
    a first logic device for logically combining the initializing signal and the column address control signal;
    a set of transistors connected in series to a power voltage and a ground voltage, each transistor of the set of transistors having a gate connected to receive an inverted signal of an output signal of the first logic device, an inverted signal, of one bit signal of the column address and the output signal of the first logic device;
    a second logic device for logically combining the initializing signal and the inverted signal of the column address control signal;
    a transmission device for transmitting the inverted signal of one bit signal of the column address signal based on an output signal of the second logic device and an inverted signal of the output signal of the second logic device; and
    a fourth transistor having a source connected to the ground voltage, a drain connected to an output terminal, and a gate connected to receive the initializing signal.

10. The circuit of claim 1, wherein the column redundancy determining circuit outputs the column redundancy signal of a low level when enabling a main column decoder and outputs the column redundancy signal of a high level when enabling a repair column decoder.

11. The circuit of claim 1, wherein the column redundancy determining circuit comprises:
    first and second logic devices for logically combining each bit of the decoded column address; and
    a third logic device for logically combining output signals of the first and second logic devices and outputting the column redundancy signal.

12. A method for repairing a column in a semiconductor memory device, comprising the steps of:
    generating an adjacent block selecting signal in response to a column redundancy start signal, the adjacent block selecting signal determining to use row repair lines of a block designated by an externally inputted block address or row repair lines of an adjacent block of the block;
    transmitting an adjacent block designating bit for designating the adjacent block among the block address and an inverted adjacent block designating bit for designating the adjacent block among an inverted block address, according to level of the adjacent block selecting signal;
    generating a plurality of column address control signals and an initializing signal of the column address control signal in response to the column redundancy start signal, the adjacent block designating bit, the inverted adjacent block designating bit, and a plurality of block address bit in which the adjacent block designating bit and the inverted adjacent block designating bit are removed from the block address and the inverted block address;
    decoding the initializing signal, the column address control signal and one bit of column address and generating a decoded column address; and
    repairing a defective column by generating a column redundancy signal in response to decoded column address.

13. The method of claim 12, wherein the step of generating the adjacent block selecting signal comprises generating the adjacent block selecting signal at a high level when using the row repair lines of the block designated by the externally inputted block address.

14. The method of claim 12, wherein the step of generating the adjacent block selecting signal comprises the step of generating the adjacent block selecting signal at a low level when using the row repair lines of the adjacent block of the block.

15. The method of claim 12, wherein the transmitting step comprises the step of transmitting the adjacent block designating bit and the inverted adjacent block designating bit when the adjacent block selecting signal is at a high level, and the step of exchanging and transmitting the adjacent block designating bit with the inverted adjacent block designating bit when the adjacent block selecting signal is at a low level.

16. The method of claim 12, wherein the repairing step comprises the step of enabling a repair column decoder when the column redundancy signal is at a high level.

* * * * *

UNITED STATES PATENT AND TRADEMARK OFFICE
CERTIFICATE OF CORRECTION

PATENT NO.    : 6,711,074 B2
DATED         : March 23, 2004
INVENTOR(S)   : Oh Won Kwon It is certified that error appears in the above-identified patent and that said Letters Patent is hereby corrected as shown below:

Column 13,
Line 32, after "device, an inverted" please delete "signal," and insert -- signal -- in its place.

Signed and Sealed this

First Day of February, 2005

JON W. DUDAS
*Director of the United States Patent and Trademark Office*